US012727436B2

(12) United States Patent
Takita et al.

(10) Patent No.: US 12,727,436 B2
(45) Date of Patent: Sep. 1, 2026

(54) WAFER PROCESSING METHOD

(71) Applicant: DISCO CORPORATION, Tokyo (JP)

(72) Inventors: Tomoharu Takita, Tokyo (JP); Hayato Kiuchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 350 days.

(21) Appl. No.: 18/644,845

(22) Filed: Apr. 24, 2024

(65) Prior Publication Data

US 2024/0379402 A1 Nov. 14, 2024

(30) Foreign Application Priority Data

May 11, 2023 (JP) ................................ 2023-078368

(51) Int. Cl.

*H10P 72/70* (2026.01)
*H10P 52/00* (2026.01)
*H10P 54/00* (2026.01)
*H10P 72/00* (2026.01)

(52) U.S. Cl.

CPC .............. *H10P 72/74* (2026.01); *H10P 52/00* (2026.01); *H10P 72/0428* (2026.01); *H10P 54/00* (2026.01); *H10P 72/7414* (2026.01)

(58) Field of Classification Search

CPC .... H10P 72/74; H10P 72/7448; H10P 72/745; H10P 72/0441; H10P 72/78

See application file for complete search history.

(56) References Cited

U.S. PATENT DOCUMENTS

2023/0039173 A1* 2/2023 Wada .................. H10P 72/0428

FOREIGN PATENT DOCUMENTS

JP 2007173487 A 7/2007
JP 2011061137 A 3/2011

* cited by examiner

*Primary Examiner* — Mohammad A Rahman
(74) *Attorney, Agent, or Firm* — Greer Burns & Crain Ltd.

(57) ABSTRACT

A wafer processing method for processing a wafer which has one side in which a circular recessed portion is formed in a region surrounded by an annular protruding portion is performed by a thermocompression bonding apparatus including a first recessed portion, a second recessed portion, and a holding table that is disposed on the second recessed portion. In the method, the wafer the one side of which is oriented upward is held from a lower side by the holding table, a sheet is sandwiched by the first recessed portion and the second recessed portion, the first recessed portion is depressurized while the second recessed portion is depressurized, pressure inside the first recessed portion is increased, the sheet is caused to come into contact with the one side of the wafer, and the sheet is heated, to thermocompression-bond the sheet to the one side of the wafer.

2 Claims, 9 Drawing Sheets

41
39a
11a
11
39
11b
13
27

WAFER PROCESSING METHOD

BACKGROUND OF THE INVENTION

Field of the Invention

The present invention relates to a processing method for a wafer that has one side in which an annular protruding portion is provided on an outer circumferential portion thereof and a circular recessed portion is formed in a region surrounded by the annular protruding portion.

Description of the Related Art

Electronic equipment as exemplified by mobile phones and personal computers has device chips mounted thereon. Device chips are typically manufactured by a wafer having a plurality of devices such as integrated circuits (ICs) formed on a face side thereof being ground and thinned on a reverse side thereof and then diced by each device. The ground and thinned wafer has low rigidity and is thus liable to crack. Hence, a region which is part of the reverse side of the wafer and which corresponds to a device formed region in which a plurality of devices are formed is ground to form a circular recessed portion, and the portion around this circular recessed portion is left as an annular protruding portion. This annular protruding portion exhibits the function of reinforcing the thinned circular recessed portion, when the wafer is being delivered, for example (see, for example, Japanese Patent Laid-open No. 2007-173487).

However, the annular protruding portion hinders division of the wafer into individual chips, and thus needs to be removed from the wafer in advance. At the time of removing the annular protruding portion, an adhesive tape is affixed to an entire region of the reverse side of the wafer including the circular recessed portion and the annular protruding portion, and the wafer is held on a holding table via the adhesive tape. The holding table has a protruding shape corresponding to the circular recessed portion of the wafer, and the circular recessed portion is fitted to this protruding shape. Further, an annular dividing groove is formed in the wafer held on the holding table, and the annular protruding portion is removed (see, for example, Japanese Patent Laid-open No. 2011-61137).

SUMMARY OF THE INVENTION

Here, when the adhesive tape is to be affixed to one side (reverse side) of the wafer, due to a step between the circular recessed portion and the annular protruding portion, a gap is generated between the adhesive tape and the wafer at an outer circumferential portion of the circular recessed portion. Moreover, since the wafer is not supported by the adhesive tape in a region overlapping with this gap, when this region is processed to form a dividing groove, chipping may occur to an unacceptable extent or cracking may occur in the wafer. Hence, the dividing groove must be formed in a region that does not overlap with the gap. However, devices cannot be formed in the wafer at a position where the dividing groove is to be formed, but forming the dividing groove by avoiding a large gap causes the problem of a smaller useful area of the wafer and reduced productivity of the device chips. Moreover, when the adhesive tape is to be affixed to the one side (reverse side) of the wafer, first, the adhesive tape is affixed to the annular protruding portion, and then elongated on an inner side of the annular protruding portion, so that the adhesive tape is affixed to the circular recessed portion in a state in which a large stress is applied thereto. Hence, there occurs such a problem that, as time passes by from the time when the adhesive tape was affixed to the wafer, the gap between the adhesive tape and the wafer widens from the outer circumference of the circular recessed portion.

It is accordingly an object of the present invention to provide a wafer processing method that is capable of disposing a sheet as an alternative to an adhesive tape on one side (reverse side) of a wafer including a circular recessed portion, without generating a large gap, while keeping the gap from widening over time.

In accordance with an aspect of the present invention, there is provided a wafer processing method for processing a wafer that has one side in which an annular protruding portion is provided on an outer circumferential portion thereof and a circular recessed portion is formed in a region surrounded by the annular protruding portion by a thermocompression bonding apparatus that includes an upper chamber including a first recessed portion that is coupled to a first depressurizing unit and that has a first opening, a lower chamber including a second recessed portion that is coupled to a second depressurizing unit and that has a second opening, and a holding table that is disposed on the second recessed portion and that holds the wafer, the upper chamber and the lower chamber being closed by the first opening and the second opening being fit together, the wafer processing method including a holding step of holding the wafer the one side of which is oriented upward, from a lower side by the holding table of the thermocompression bonding apparatus, a sealing step of sandwiching a sheet of a frame unit including an annular frame having at a center thereof an opening portion capable of housing the wafer and the sheet fixed to an outer circumferential portion of the annular frame, by the first opening of the first recessed portion and the second opening of the second recessed portion, at an inner side of the opening portion, and closing the first recessed portion and the second recessed portion, a depressurizing step of depressurizing the first recessed portion by the first depressurizing unit and depressurizing the second recessed portion by the second depressurizing unit, after the sealing step, a contacting step of causing the sheet to come into contact with the annular protruding portion and the circular recessed portion by increasing pressure inside the first recessed portion and causing the sheet to come into contact with the one side of the wafer, after the depressurizing step, and a thermocompression-bonding step of heating the sheet and thermocompression-bonding the sheet to the one side of the wafer, after the contacting step.

Preferably, the wafer processing method further includes a dividing groove forming step of forming, in the wafer, a dividing groove that cuts off the annular protruding portion, after the thermocompression-bonding step, and a removing step of removing the annular protruding portion from the sheet, after the dividing groove forming step.

In the wafer processing method according to an aspect of the present invention, a sheet is caused to come into contact with an annular protruding portion and a circular recessed portion of a wafer, is heated, and is then thermocompression-bonded to the wafer. The sheet does not stick to the annular protruding portion of the wafer even when the sheet comes into contact with the annular protruding portion of the wafer. Thus, until the sheet thereafter comes into contact with the circular recessed portion, the sheet is drawn into the circular recessed portion also from the outer side of the annular protruding portion. In this case, the stress applied to the sheet is distributed, so that the sheet comes into contact with the circular recessed portion without receiving a locally large stress. Thereafter, the sheet is thermocompression-bonded to the wafer. As a result, the sheet can be fixed to the wafer in a state in which a gap generated between the wafer and the sheet is extremely small, so that, compared to a case in which an adhesive tape is fixed to the wafer, there is no need to significantly reduce the device forming area in consideration of such a gap. In other words, a relatively large useful area can be reserved in the wafer, and the productivity of device chips can be improved. Moreover, since no large stress is applied to the sheet that is thermocompression-bonded to the wafer, the widening of the gap between the sheet and the wafer over time would also be extremely limitative.

Accordingly, one aspect of the present invention provides a wafer processing method that is capable of disposing a sheet as an alternative to an adhesive tape on one side (reverse side) of a wafer which has a circular recessed portion, without generating a large gap, while keeping the gap from widening over time.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
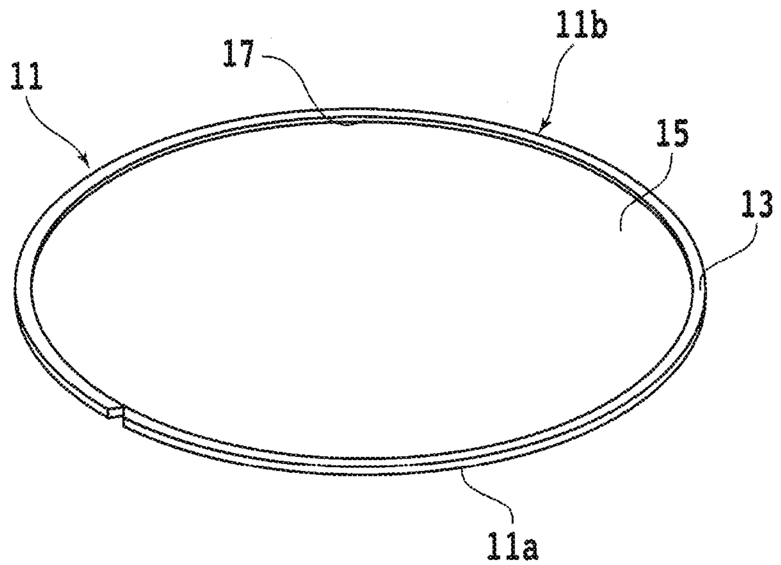
FIG. 1A is a perspective view schematically illustrating a reverse side (one side) of a wafer.
Figure 1B:
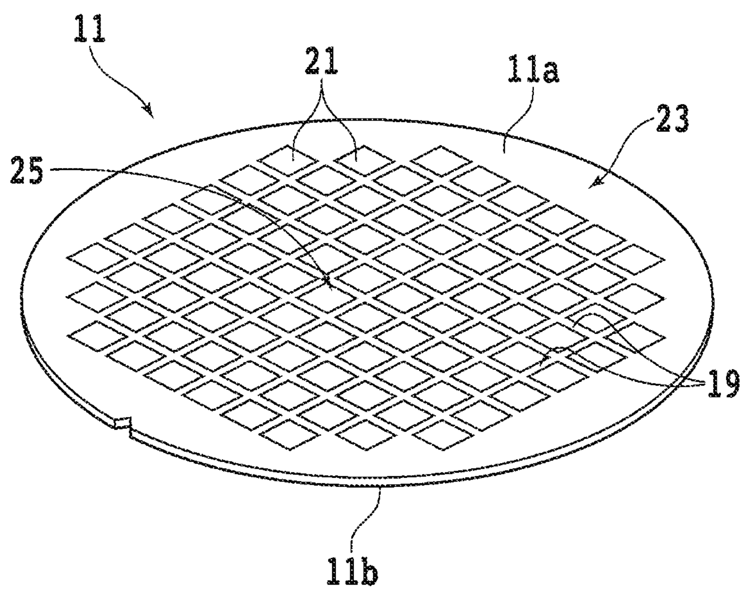
FIG. 1B is a perspective view schematically illustrating a face side of the wafer.

An embodiment according to one aspect of the present invention will be described with reference to the attached drawings. FIG. 1A is a perspective view schematically illustrating a reverse side (one side) of a wafer, and FIG. 1B is a perspective view schematically illustrating a face side of the wafer. First, the wafer to be processed by a wafer processing method according to the present embodiment will be described.

The wafer, denoted by 11, is a circular plate-shaped single crystal substrate formed with a semiconductor material such as silicon (Si) or silicon carbide (SiC), for example. Note, however, that there are no limitations on the shape, structure, size, and the like of the wafer 11. As illustrated in FIG. 1B, on a face side 11*a* of the wafer 11, a plurality of projected dicing lines 19 are set in a grid pattern. In regions partitioned by the plurality of projected dicing lines 19, devices 21 as exemplified by ICs and large-scale integration (LSI) circuits are formed. A region that is part of the face side 11*a* of the wafer 11 and that is on an outer circumferential portion surrounding a region in which the plurality of devices 21 are formed is called an outer circumferential surplus region 23. Further, a region that is part of the face side 11*a* of the wafer 11, that is surrounded by the outer circumferential surplus region 23, and in which the plurality of devices 21 are formed is called a device formed region 25.

When the wafer 11 in which the plurality of devices 21 are formed is ground and thinned from a reverse side 11*b* and is diced along the projected dicing lines 19, a plurality of thin device chips each including the device 21 can be obtained. Dicing the wafer 11 is, for example, performed by a cutting apparatus including an annular cutting blade. However, a ground and thinned wafer 11 has low rigidity and is liable to cracking, thus being difficult to handle upon delivery, for example. As such, as illustrated in FIG. 1A, a region that is part of the reverse side 11*b* of the wafer 11 and that corresponds to the device formed region 25 in which the plurality of devices 21 are formed is ground to form a circular recessed portion 15, and a portion around the circular recessed portion 15 is left as an annular protruding portion 13. This annular protruding portion 13 exhibits the function of reinforcing the thinned circular recessed portion 15, when the wafer 11 is being delivered, for example. This preserves the rigidity of the wafer 11, making it less likely for warp and cracking to occur and easier to handle the wafer 11.

However, when the wafer 11 having the annular protruding portion 13 on the reverse side 11*b* is to be directly diced along the projected dicing lines 19 by the cutting apparatus, dicing grooves formed in the wafer 11 to dice the thin circular recessed portion 15 are insufficient to cut off the thick annular protruding portion 13. In other words, the annular protruding portion 13 hinders the dicing of the wafer 11 into individual chips. Hence, the annular protruding portion 13 needs to be removed from the wafer 11 before the wafer 11 is diced. In the wafer processing method according to the present embodiment, a sheet is thermocompression-bonded to the entire region of one side (reverse side 11*b*) of the wafer 11 including the circular recessed portion 15 and the annular protruding portion 13. The wafer 11 is held on a holding table of a dicing apparatus via the sheet.

Figure 3A:
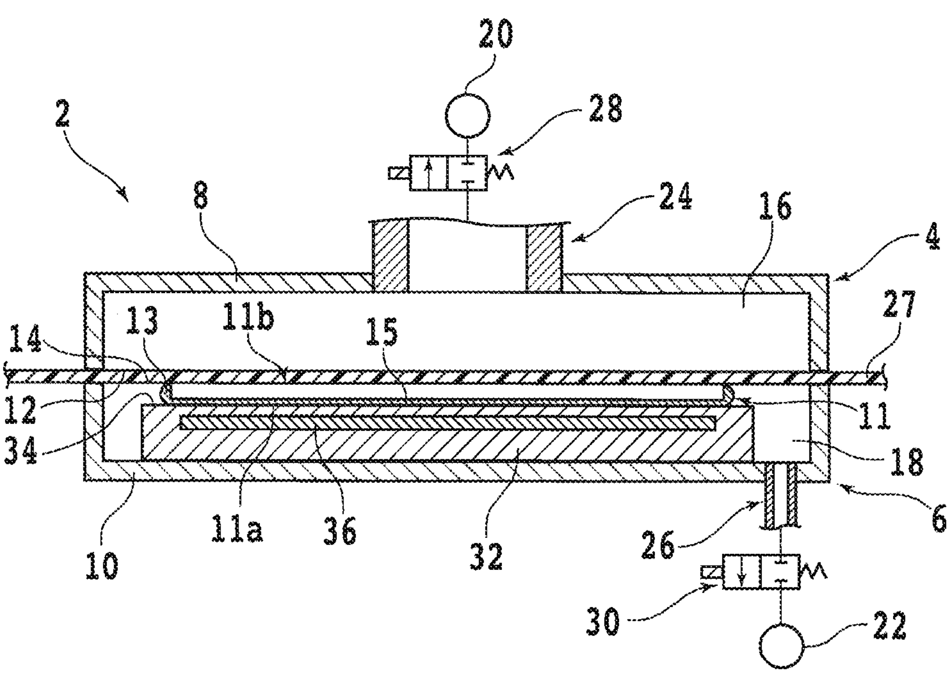
FIG. 3A is a cross sectional view schematically illustrating the thermocompression bonding apparatus in a sealing step.

The sheet to be thermocompression-bonded to the wafer 11 will next be described. FIG. 3A and other relevant drawings each include a cross sectional view schematically illustrating the sheet denoted by 27. The sheet 27 has a diameter larger than an outer diameter of the wafer 11 but includes no glue layer. Further, the sheet 27 is a sheet having thermoplasticity. An outer circumferential portion of the sheet 27 is disposed on an annular frame 39 made of metal (see FIGS. 7A, 7B, and 8). The sheet 27 is, for example, a resin sheet having flexibility as exemplified by a polyolefin sheet and a polyester sheet, but the material of the sheet 27 is not limited to any of the above.

Here, a polyolefin sheet is a sheet of a polymer obtained by synthesizing alkenes as the monomer. The polyolefin sheet to be used for the sheet 27 is, for example, a sheet that is transparent or translucent with respect to visible light, such as a polyethylene sheet, a polypropylene sheet, or a polystyrene sheet. Moreover, a polyester sheet is a sheet of a polymer obtained by synthesizing a dicarboxylic acid (a compound containing two carboxyl groups) and a diol (a compound containing two hydroxyl groups) as the monomers. The polyester sheet to be used for the sheet 27 is, for example, a sheet that is transparent or translucent with respect to visible light, such as a polyethylene terephthalate sheet or a polyethylene naphthalate sheet.

Since the sheet 27 includes no glue layer (adhesive layer) and thus has insufficient adhesion, the sheet 27 cannot be affixed to the wafer 11. Yet, as the sheet 27 has thermoplasticity, when the sheet 27 is heated to a temperature close to the melting temperature in a state in which a predetermined pressure is applied and the sheet 27 is joined to the wafer 11, the sheet 27 partially melts down and can be fixed to the wafer 11. In other words, the sheet 27 can be thermocompression-bonded to the wafer 11.

Figures 7A, 7B:
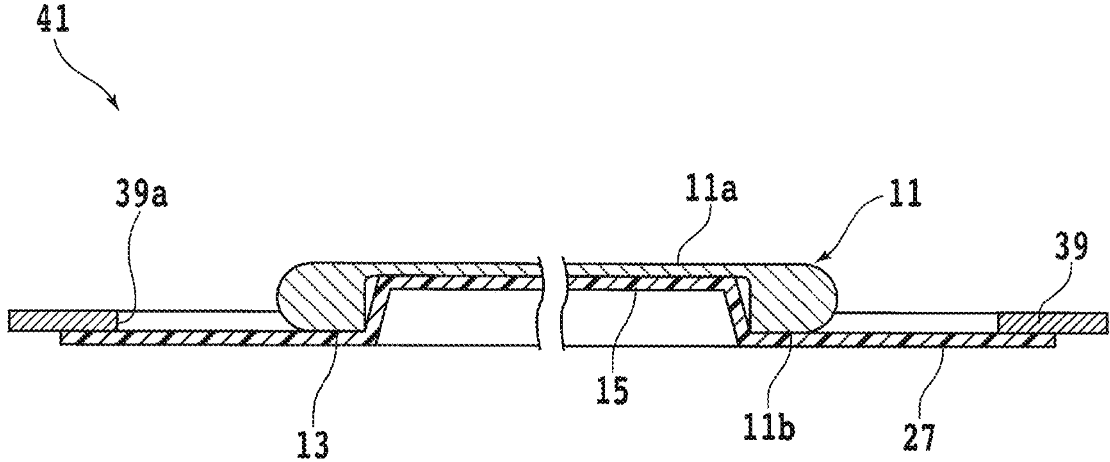
FIG. 7A is a cross sectional view schematically illustrating a state in which the sheet is integrated with the wafer and an annular frame.
FIG. 7B is a cross sectional view schematically illustrating a manner in which the annular protruding portion is separated from the wafer in a removing step.
Figure 8:
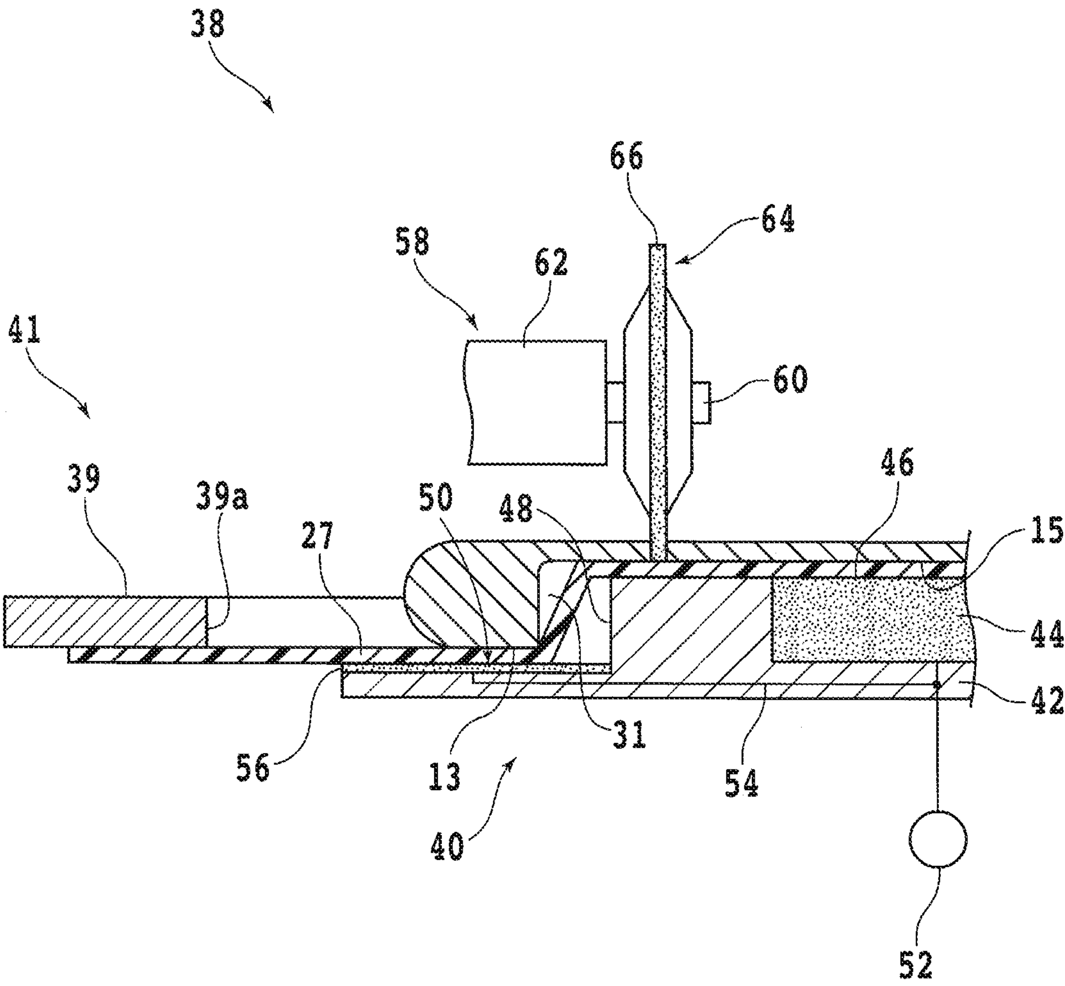
FIG. 8 is a cross sectional view schematically illustrating a cutting apparatus in a dividing groove forming step.

Further, as illustrated in FIGS. 7A, 7B, and 8, the outer circumferential portion of the sheet 27 is disposed beforehand on the annular frame 39 made of metal. The annular frame 39 includes an opening portion (through hole) 39*a* having a larger diameter than the diameter of the wafer 11. For example, the sheet 27 is thermocompression-bonded to the annular frame 39 in advance. Alternatively, the sheet 27 is affixed to the annular frame 39 in advance by an adhesive, for example.

When the wafer 11, the sheet 27, and the annular frame 39 are finally integrated, a frame unit 41 (see FIGS. 7A and 7B and other relevant drawings) is formed. When the frame unit 41 is formed, the wafer 11 can be handled via the sheet 27, making it easier to handle the wafer 11. Moreover, when the wafer 11 constituting part of the frame unit 41 is diced, the formed individual device chips are continuously supported by the sheet 27, also making it easier to handle the device chips.

Figure 2A:
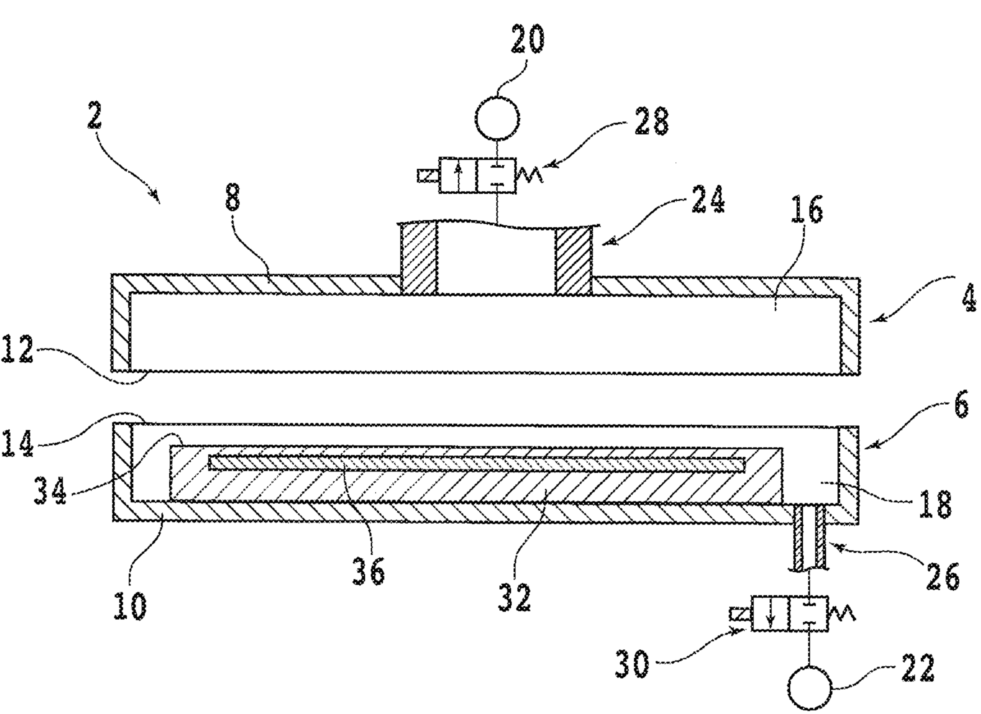
FIG. 2A is a cross sectional view schematically illustrating a thermocompression bonding apparatus.

A description will next be given of a thermocompression bonding apparatus 2 that thermocompression-bonds the sheet 27 to the wafer 11 in the wafer processing method according to the present embodiment. FIGS. 2A to 4 each include a cross sectional view schematically illustrating the thermocompression bonding apparatus 2. FIG. 2A is a cross sectional view schematically illustrating an example of the thermocompression bonding apparatus 2. The thermocompression bonding apparatus 2 is, for example, a chamber-like unit having in its inside a space in which the wafer 11 can be housed, and has the function of thermocompression-bonding the sheet 27 to the reverse side 11*b* of the wafer 11. The thermocompression bonding apparatus 2 includes a recessed lower chamber 6 that is opened upward and a recessed upper chamber 4 that is disposed above the lower chamber 6 and that is opened downward.

The upper chamber 4 of the thermocompression bonding apparatus 2 includes a first recessed portion 8 that is coupled to a first depressurizing unit 20 and that has a first opening 12. The lower chamber 6 includes a second recessed portion 10 that is coupled to a second depressurizing unit 22 and that has a second opening 14. The first depressurizing unit 20 and the second depressurizing unit 22 are, for example, vacuum pumps such as rotary pumps. Note, however, that the first depressurizing unit 20 and the second depressurizing unit 22 are not limited to such pumps. The thermocompression bonding apparatus 2 further includes a holding table 32 that is disposed on the second recessed portion 10 and that holds the wafer 11. When the first opening 12 of the upper chamber 4 and the second opening 14 of the lower chamber 6 are fit together, the upper chamber 4 and the lower chamber 6 can be closed.

A more detailed description will be given of the thermocompression bonding apparatus 2. The first opening 12 of the upper chamber 4 and the second opening 14 of the lower chamber 6 each have an inner diameter larger than the diameter of the wafer 11. The first recessed portion 8 of the upper chamber 4 and the second recessed portion 10 of the lower chamber 6 each have an outer diameter smaller than an inner diameter of the annular frame 39 that is disposed on the outer circumferential portion of the sheet 27. For example, the upper chamber 4 can be lifted and lowered. The second opening 14 of the lower chamber 6 and the first opening 12 of the upper chamber 4 have the same shape, and when the upper chamber 4 is lowered toward the lower chamber 6 such that the first opening 12 overlaps with the second opening 14, a space isolated from the outside is formed inside the upper chamber 4 and the lower chamber 6.

The lower chamber 6 is provided with the table-shaped holding table 32 that supports the wafer 11. An upper surface of the holding table 32 constitutes a flat holding surface 34 that supports and holds the wafer 11. The holding table 32 may include a suction channel (not illustrated) that communicates with the holding surface 34 and a suction source (not illustrated) that is connected to the suction channel. In this case, when a suction force generated at the suction source is caused to act, through the suction channel, on the wafer 11 placed on the holding surface 34 of the holding table 32, the wafer 11 can be held under suction on the holding table 32. The height of the holding table 32 is adjusted in such a manner that, when the wafer 11 is placed on the holding surface 34, the height of the reverse side 11*b* of the wafer 11 and the height of the second opening 14 of the lower chamber 6 become substantially the same. Alternatively, the height of the holding table 32 is adjusted in such a manner that the height of the second opening 14 of the lower chamber 6 becomes greater than the height of the reverse side 11*b* of the wafer 11.

To a ceiling or a sidewall of the upper chamber 4, an exhaust section 24 is connected. The exhaust section 24 is an exhaust passage which has one end connected to the first recessed portion 8 of the upper chamber 4 and another end connected to the first depressurizing unit 20. The exhaust passage of the exhaust section 24 is provided with a first electromagnetic valve 28 (for example, a solenoid valve) that switches the state of connection between the upper chamber 4 and the first depressurizing unit 20. Specifically, when the first electromagnetic valve 28 is operated, the state of connection between the upper chamber 4 and the first depressurizing unit 20 is switched between the two states:

the state in which the two members are connected to each other and the state in which the two members are separated from each other. To a bottom wall or a sidewall of the lower chamber 6, an exhaust section 26 is connected. The exhaust section 26 is an exhaust passage which has one end connected to the second recessed portion 10 of the lower chamber 6 and another end connected to the second depressurizing unit 22. The exhaust passage of the exhaust section 26 is provided with a second electromagnetic valve 30 (for example, a solenoid valve) that switches the state of connection between the lower chamber 6 and the second depressurizing unit 22. Specifically, when the second electromagnetic valve 30 is operated, the state of connection between the lower chamber 6 and the second depressurizing unit 22 is changed between the two states: the state in which the two members are connected to each other and the state in which the two members are separated from each other.

When the first electromagnetic valve 28 is operated to connect the first depressurizing unit 20 and the upper chamber 4, an internal space 16 of the upper chamber 4 can be depressurized. Similarly, when the second electromagnetic valve 30 is operated to connect the second depressurizing unit 22 and the lower chamber 6, an internal space 18 of the lower chamber 6 can be depressurized.

The thermocompression bonding apparatus 2 includes a heating unit that heats the wafer 11 placed on the holding table 32 and the sheet 27 placed on the wafer 11. For example, inside the holding table 32, a heater 36 that can function as the heating unit is disposed. The heater 36 is, for example, a heating wire. When the heater 36 is operated, the wafer 11 is heated, and also the sheet 27 is heated through the wafer 11. Note, however, that the heating unit included in the thermocompression bonding apparatus 2 is not limited to such heater. For example, the first recessed portion 8 of the upper chamber 4 may be provided with a heating unit (not illustrated) that provides heated air to the internal space 16 of the upper chamber 4. The heating unit includes, for example, an air blower that generates a flow of air and a heater that can heat air. When the wafer 11 is placed on the holding table 32, the sheet 27 is disposed on the wafer 11, and heated air is supplied to the sheet 27 from the heating unit, the sheet 27 can be heated.

Figure 9:
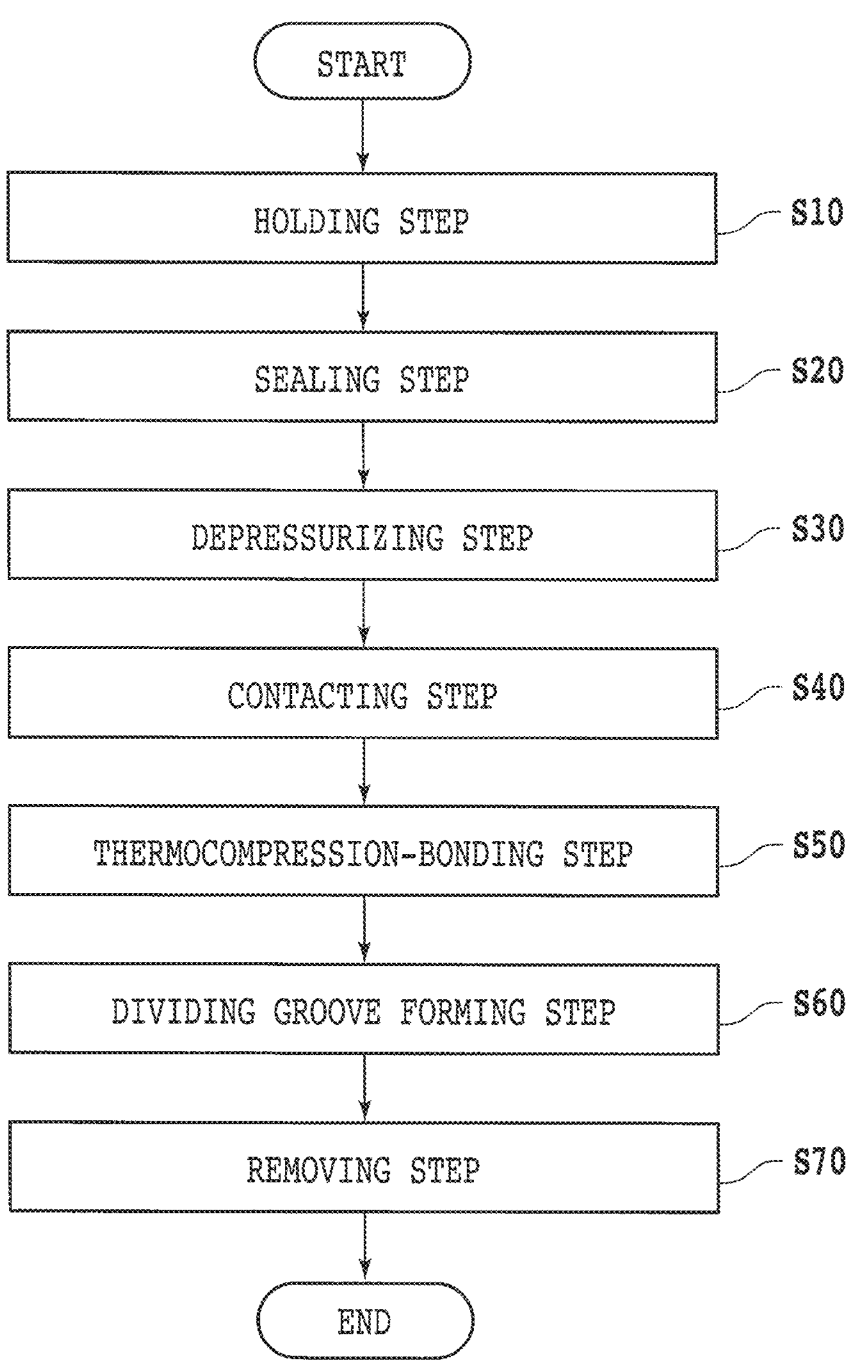
FIG. 9 is a flowchart illustrating a flow of steps of a wafer processing method.

The wafer processing method according to the present embodiment that is implemented by use of the thermocompression bonding apparatus 2 will next be described. The wafer processing method according to the present embodiment is, for example, performed as part of a device chip manufacturing method for forming device chips by dicing the wafer 11. FIG. 9 is a flowchart illustrating a flow of steps of the wafer processing method (device chip manufacturing method). In the following description, the wafer processing method according to the present embodiment is described, but the following description is also applicable to the steps of the device chip manufacturing method.

Figure 2B:
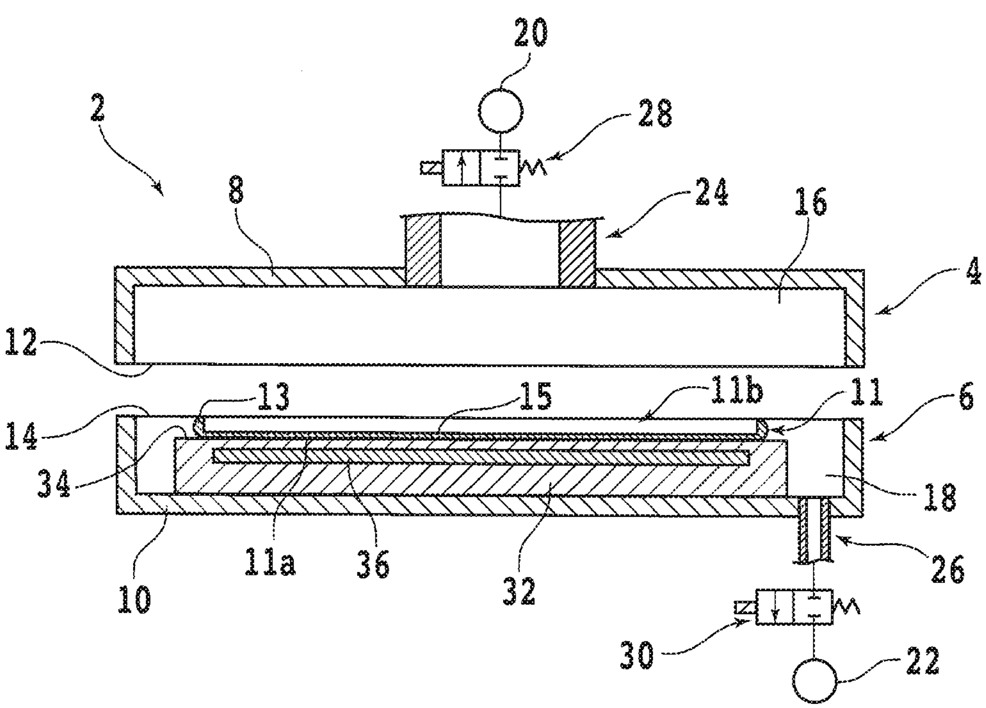
FIG. 2B is a cross sectional view schematically illustrating the thermocompression bonding apparatus in a holding step.

In the wafer processing method according to the present embodiment, first performed is a holding step S10 of holding the wafer 11 whose one side (reverse side 11*b*) is oriented upward, from a lower side by the holding table 32 of the thermocompression bonding apparatus 2. FIG. 2B is a cross sectional view schematically illustrating the thermocompression bonding apparatus 2 and the wafer 11 in the holding step S10. In the holding step S10, the face side 11*a* of the wafer 11 is oriented downward, and the wafer 11 is moved to a position above the holding table 32, to cause the face side 11*a* of the wafer 11 to face the holding surface 34 of the holding table 32. Then, the wafer 11 is placed on the holding surface 34 of the holding table 32, and the suction source of the holding table 32 is operated to hold the wafer 11 under suction on the holding table 32. At this time, the one side (reverse side 11*b*) on which the sheet 27 is to be thermocompression-bonded will be exposed upward.

Next, a sealing step S20 of sandwiching the sheet 27 fixed to the annular frame 39, by the upper chamber 4 and the lower chamber 6 of the thermocompression bonding apparatus 2, and sealing the internal space 16 of the upper chamber 4 and the internal space 18 of the lower chamber 6 is performed. FIG. 3A is a cross sectional view schematically illustrating the thermocompression bonding apparatus 2 in the sealing step S20. In the sealing step S20, the frame unit 41 including the annular frame 39 (see FIG. 7A and other relevant drawings) which has at its center the opening portion 39*a* in which the wafer 11 can be housed and the sheet 27 fixed to the outer circumferential portion of the annular frame 39 is placed on the lower chamber 6. At this time, the second opening 14 of the lower chamber 6 is closed by the sheet 27. Note that the position of the annular frame 39 is adjusted such that the annular frame 39 does not overlap with the first opening 12 and the second opening 14. The upper chamber 4 is then lowered, the sheet 27 of the frame unit 41 is sandwiched by the first opening 12 of the first recessed portion 8 and the second opening 14 of the second recessed portion 10 at the inner side of the opening portion 39*a* of the annular frame 39, and the first recessed portion 8 and the second recessed portion 10 are closed. At this time, the internal space 16 of the upper chamber 4 is sealed by the sheet 27 and the first recessed portion 8. Similarly, the internal space 18 of the lower chamber 6 is sealed by the sheet 27 and the second recessed portion 10.

Figure 3B:
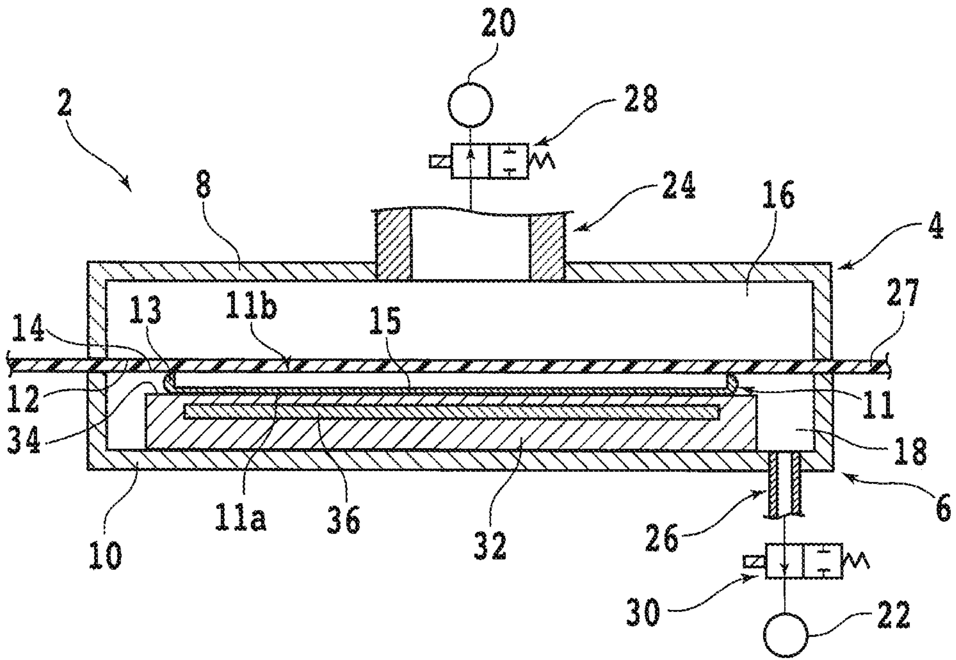
FIG. 3B is a cross sectional view schematically illustrating the thermocompression bonding apparatus in a depressurizing step.

In the wafer processing method according to the present embodiment, after the sealing step S20, a depressurizing step S30 of depressurizing the first recessed portion 8 by the first depressurizing unit 20 and depressurizing the second recessed portion 10 by the second depressurizing unit 22 is performed. FIG. 3B is a cross sectional view schematically illustrating the thermocompression bonding apparatus 2 in the depressurizing step S30. In the depressurizing step S30, the first electromagnetic valve 28 is operated to connect the first depressurizing unit 20 and the upper chamber 4. As a result, air inside the internal space 16 of the first recessed portion 8 of the upper chamber 4 is exhausted through the exhaust section 24 by the first depressurizing unit 20, and the internal space 16 is depressurized. Further, in the depressurizing step S30, the second electromagnetic valve 30 is operated to connect the second depressurizing unit 22 and the lower chamber 6. As a result, air inside the internal space 18 of the second recessed portion 10 of the lower chamber 6 is exhausted through the exhaust section 26 by the second depressurizing unit 22, and the internal space 18 is depressurized.

Figure 4:
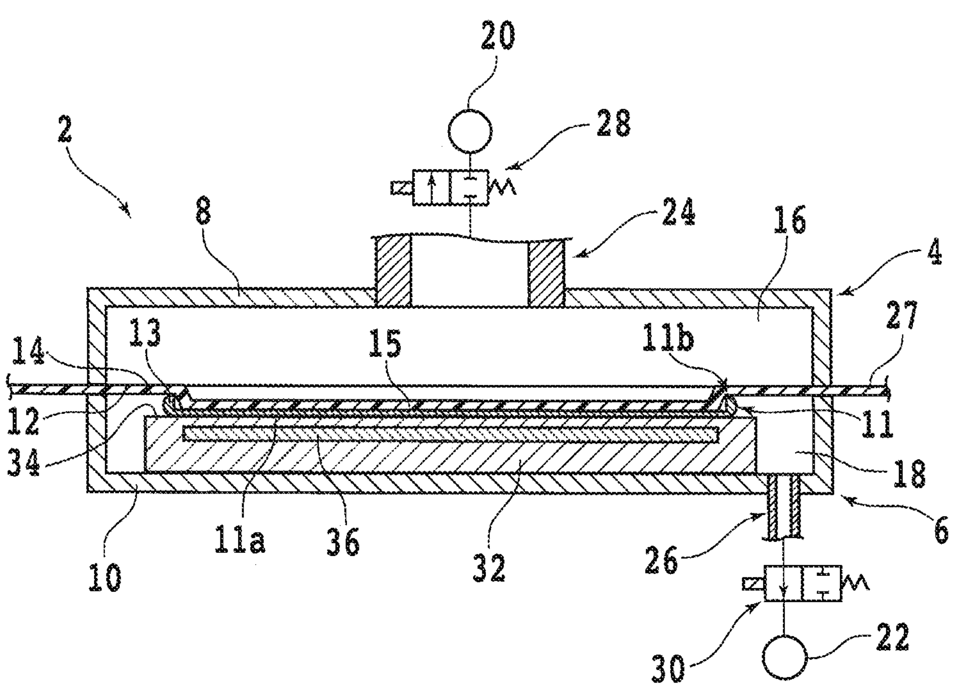
FIG. 4 is a cross sectional view schematically illustrating the thermocompression bonding apparatus in a contacting step.

In the wafer processing method according to the present embodiment, after the depressurizing step S30, a contacting step S40 of causing the sheet 27 to come into contact with the annular protruding portion 13 and the circular recessed portion 15 by increasing the pressure inside the first recessed portion 8 and causing the sheet 27 to come into contact with the one side (reverse side 11*b*) of the wafer 11 is performed. FIG. 4 is a cross sectional view schematically illustrating the thermocompression bonding apparatus 2 in the contacting step S40. In the contacting step S40, first, depressurizing of the upper chamber 4 by the first depressurizing unit 20 is stopped. That is, the first electromagnetic valve 28 is operated to cancel the connection between the first depressurizing unit 20 and the upper chamber 4. At this time, the second electromagnetic valve 30 is not operated, to maintain the connection between the second depressurizing unit 22 and the lower chamber 6.

In this case, the pressure inside the internal space 16 of the upper chamber 4 gradually increases. Alternatively, the thermocompression bonding apparatus 2 may be able to cause the upper chamber 4 to connect to open air through the exhaust section 24, for example. In this case, when the upper chamber 4 is connected to open air, air rapidly flows into the internal space 16, and the pressure inside the internal space 16 of the upper chamber 4 sharply increases. When the pressure inside the internal space 16 of the upper chamber 4 becomes higher than the pressure inside the internal space 18 of the lower chamber 6, a downward force is applied to the sheet 27 that separates the internal space 16 and the internal space 18 between the two internal spaces. As a result, the sheet 27 is pressed toward the one side (reverse side 11*b*) of the wafer 11 and is deformed to match the shape of the one side (reverse side 11*b*) of the wafer 11.

In the contacting step S40, first, the sheet 27 comes into contact with the annular protruding portion 13 on the one side (reverse side 11*b*) of the wafer 11. Alternatively, the sheet 27 is already in contact with the annular protruding portion 13 at a point in time when the contacting step S40 is to be started. At this time, unlike an adhesive tape which has a glue layer and has adhesion, the sheet 27 does not stick to the annular protruding portion 13. The sheet 27 can freely slide and move with respect to the annular protruding portion 13. As the contacting step S40 advances, the sheet 27 deforms in such a manner as to dig into the circular recessed portion 15 at the inner side of the annular protruding portion 13 and proceeds toward the circular recessed portion 15 to eventually come into contact with the circular recessed portion 15. When the sheet 27 comes into contact with the major portions of the one side (reverse side 11*b*) of the wafer 11 including the annular protruding portion 13 and the circular recessed portion 15, the contacting step S40 is completed. At the time when the contacting step S40 is completed, such a force that is sufficient to fix the sheet 27 and the wafer 11 to each other is not acting between the two members. As such, in order to fix the sheet 27 to the wafer 11, after the contacting step S40, a thermocompression-bonding step 50 of heating the sheet 27 and thermocompression-bonding the sheet 27 to the one side (reverse side 11*b*) of the wafer 11 is performed.

In the thermocompression-bonding step S50, the heating unit of the thermocompression bonding apparatus 2 is operated to heat the sheet 27. For example, when the thermocompression bonding apparatus 2 has the heater 36 as the heating unit, the heater 36 is operated to heat both the wafer 11 and the sheet 27. When the sheet 27 is heated to a temperature close to the melting temperature thereof in a state in which the sheet 27 is pressed toward the wafer 11 due to a pressure difference between the internal space 16 of the first recessed portion 8 and the internal space 18 of the second recessed portion 10, the sheet 27 is thermocompression-bonded to the wafer 11. After the sheet 27 is thermocompression-bonded to the wafer 11, the heating unit (heater 36) is stopped, and the heating of the sheet 27 is also stopped.

Note that, at the time of performing thermocompression-bonding, the sheet 27 is preferably heated to a temperature that is equal to or lower than the melting temperature thereof. This is because, when the heating temperature exceeds the melting temperature, the sheet 27 may dissolve and be unable to maintain the sheet-shape. The sheet 27 is also preferably heated to a temperature that is equal to or higher than the softening temperature thereof. This is because thermocompression-bonding would not be performed appropriately if the heating temperature has not reached the softening temperature. That is, the sheet 27 is preferably heated to a temperature that is equal to or higher than the softening temperature thereof but equal to or lower than the meting temperature thereof. Further, some sheets 27 may not have a specific softening temperature. Thus, at the time of performing thermocompression-bonding, the sheet 27 is preferably heated to a temperature that is equal to or higher than a temperature 20 degrees lower than the melting temperature thereof but equal to or lower than the melting temperature thereof.

For example, in a case where the polyolefin sheet to be used as the sheet 27 is a polyethylene sheet, the heating temperature is preferably 120° C. to 140° C. Alternatively, in a case when the polyolefin sheet is a polypropylene sheet, the heating temperature is preferably 160° C. to 180° C. In a case where the polyolefin sheet is a polystyrene sheet, the heating temperature is preferably 220° C. to 240° C. Further, in a case where the polyester sheet to be used as the sheet 27 is a polyethylene terephthalate sheet, the heating temperature is 250° C. to 270° C. Further, in a case where the polyester sheet is a polyethylene naphthalate sheet, the heating temperature is 160° C. to 180° C. Note, however, that the heating temperature of the sheet 27 is not limited to the abovementioned examples.

After the heating unit is stopped to stop heating the sheet 27, the second electromagnetic valve 30 is operated to cancel the connection between the second depressurizing unit 22 and the lower chamber 6, and the pressure inside the internal space 18 of the lower chamber 6 is restored back to atmospheric pressure, the upper chamber 4 is lifted. As a result, the frame unit 41 in which the sheet 27, the wafer 11, and the annular frame 39 are integrated is obtained, as illustrated in FIG. 7A.

In the past, when an adhesive tape having adhesion was affixed to the wafer 11 having the annular protruding portion 13 and the circular recessed portion 15 on the one side (reverse side 11*b*) thereof, a relatively large gap was generated between the adhesive tape and the one side of the wafer 11. In contrast, when the sheet 27 is thermocompression-bonded to the wafer 11 in the wafer processing method according to the present embodiment, the gap generated between the sheet 27 and the one side of the wafer 11 is relatively small. One of the advantages produced by the wafer processing method according to the present embodiment will be described in detail.

Figure 5A:
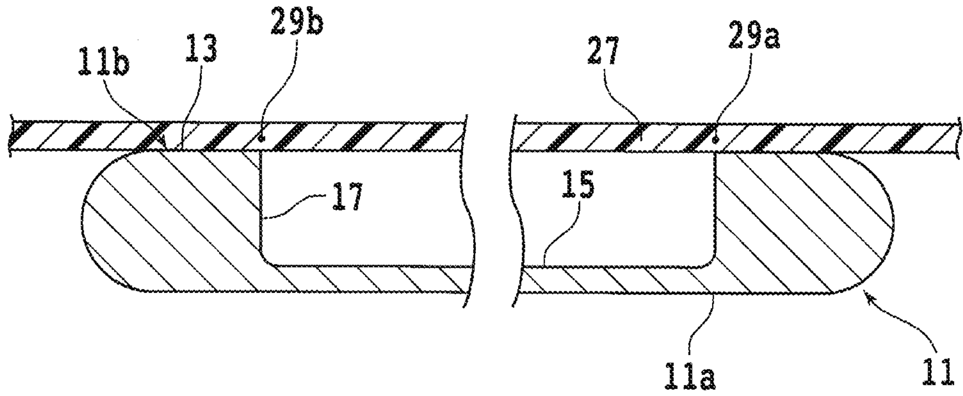
FIG. 5A is a cross sectional view schematically illustrating a manner in which a sheet comes into contact with an annular protruding portion of the wafer.
Figure 5B:
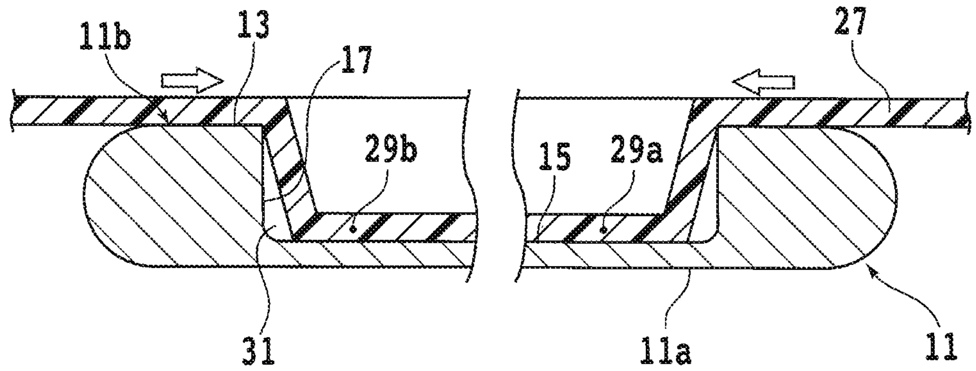
FIG. 5B is a cross sectional view schematically illustrating a manner in which the sheet comes into contact with a circular recessed portion of the wafer.

FIG. 5A is a cross sectional view schematically illustrating a state in which the sheet 27 is in contact with the annular protruding portion 13 on the one side (reverse side 11*b*) of the wafer 11 in the contacting step S40. At this point in time, the sheet 27 is neither thermocompression-bonded to the wafer 11 nor fixed thereto. Here, focus is placed on points 29*a* and 29*b* in the sheet 27 that overlap with a step 17 connecting the annular protruding portion 13 and the circular recessed portion 15. As the contacting step S40 advances, the sheet 27 is pressed toward the circular recessed portion 15 and deforms. FIG. 5B is a cross sectional view schematically illustrating the state in which the sheet 27 is in contact with the circular recessed portion 15 on the one side (reverse side 11*b*) of the wafer 11 in the contacting step S40. Also at this point in time, the sheet 27 is neither thermocompression-bonded to the wafer 11 nor fixed thereto.

Here, until the sheet 27 comes into contact with the circular recessed portion 15, the sheet 27 is drawn toward the circular recessed portion 15 also from the outer side of the annular protruding portion 13. Thus, as illustrated in FIG. 5B. the points 29*a* and 29*b* in the sheet 27 also move. In other words, the sheet 27 comes into contact with the circular recessed portion 15 along with the major move of the points in the sheet 27. Thus, the stress applied to the sheet 27 is distributed, and a locally large stress is not applied to the sheet 27 near the circular recessed portion 15. Moreover, as a sufficient amount of the sheet 27 is drawn toward the circular recessed portion 15, a gap 31 between the sheet 27 and the wafer 11 becomes extremely small. Further, since no large stress remains on the sheet 27 that has been thermocompression-bonded to the wafer 11, the sheet 27 peeling off from the wafer 11 over time becomes extremely limitative.

Figure 6A:
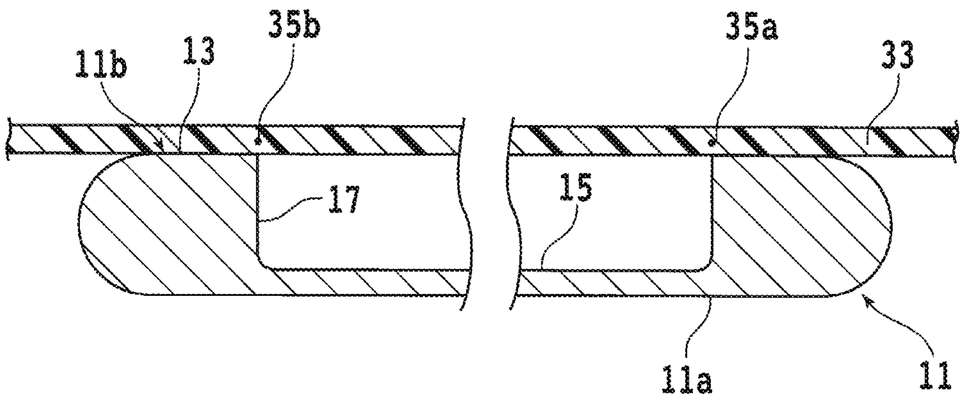
FIG. 6A is a cross sectional view schematically illustrating a manner in which an adhesive tape comes into contact with the annular protruding portion of the wafer.

For comparison, a case of affixing an adhesive tape to the wafer 11 by a method in the related art that is different from the wafer processing method according to the present embodiment will be examined. FIG. 6A is a cross sectional view schematically illustrating a state in which an adhesive tape 33 is in contact with the annular protruding portion 13 on the one side (reverse side 11*b*) of the wafer 11. When the adhesive tape 33 comes into contact with the annular protruding portion 13 of the wafer 11, the adhesive tape 33 is fixed to the annular protruding portion 13. Here, focus will be placed on points 35*a* and 35*b* in the adhesive tape 33 that overlap with the step 17 connecting the annular protruding portion 13 and the circular recessed portion 15.

Figure 6B:
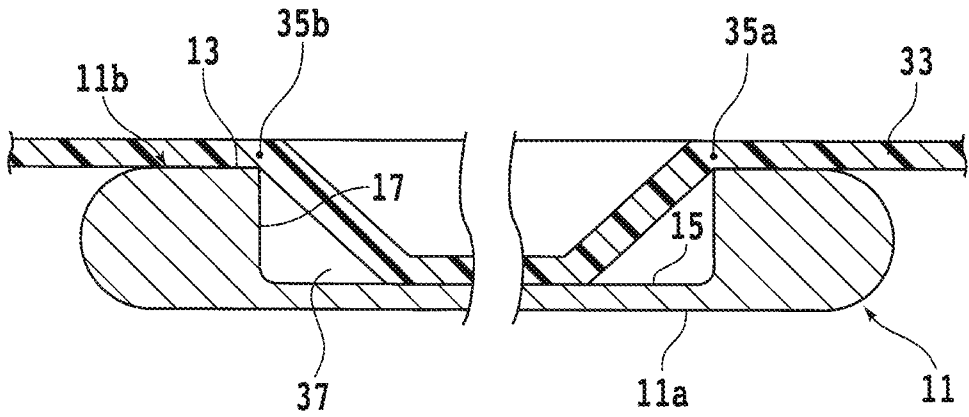
FIG. 6B is a cross sectional view schematically illustrating a manner in which the adhesive tape comes into contact with the circular recessed portion of the wafer.

The adhesive tape 33 is pressed toward the circular recessed portion 15 and deforms. FIG. 6B is a cross sectional view schematically illustrating the state in which the adhesive tape 33 is in contact with the circular recessed portion 15 on the one side (reverse side 11*b*) of the wafer 11. At this point in time, the adhesive tape 33 is affixed and fixed to the circular recessed portion 15 of the wafer 11. Here, since the adhesive tape 33 is fixed to the annular protruding portion 13, the adhesive tape 33 is not drawn toward the circular recessed portion 15 from the outer side of the annular protruding portion 13 until the adhesive tape 33 comes into contact with the circular recessed portion 15. Thus, the points 35*a* and 35*b* in the adhesive tape 33 do not move, as illustrated in FIG. 6B. In other words, the adhesive tape 33 is deformed only at the inner side region of the annular protruding portion 13 and affixed to the circular recessed portion 15. Since the adhesive tape 33 locally and largely deforms in this process, a locally large stress is applied to the adhesive tape 33. When the adhesive tape 33 is fixed to the circular recessed portion 15 in a state in which a large stress is applied thereto, the adhesive tape 33 is more likely to peel off from the wafer 11 over time.

Further, since the adhesive tape 33 is not drawn toward the circular recessed portion 15, a large gap 37 is formed between the adhesive tape 33 and the wafer 11. As described later, a cutting blade is caused to cut into the outer circumferential portion of the circular recessed portion 15 when the annular protruding portion 13 is to be cut off from the wafer 11. In this case, since the circular recessed portion 15 is not sufficiently supported at a portion overlapping with the gap 37, processing by the cutting blade is inappropriate for such portion. Hence, at the time of removing the annular protruding portion 13, the cutting blade must be caused to cut into the wafer 11 at a significantly inner position with respect to the outer circumference of the circular recessed portion 15. In this case, since the devices 21 (see FIG. 1B) cannot be formed in the regions where the cutting blade cuts in, the useful area of the wafer 11 is reduced, and the number of device chips that can be manufactured from the wafer 11 declines, resulting in lower manufacturing efficiency of device chips.

In contrast, the wafer processing method according to the present embodiment makes the gap 31 generated between the sheet 27 and the wafer 11 relatively small. Thus, the cutting blade can cut the wafer 11 at a position closer to the outer circumference of the circular recessed portion 15, so that a relatively large useful area of the wafer 11 can be reserved. More specifically, the number of device chips that can be manufactured from the wafer 11 can be increased, leading to higher manufacturing efficiency of the device chips. Further, the gap 31 is unlikely to widen over time, leading to favorable preservability of the frame unit 41 that is available after the sheet 27 has been thermocompression-bonded to the wafer 11.

In the wafer processing method according to the present embodiment, after the thermocompression-bonding step S50, a dividing groove forming step S60 of forming, in the wafer 11, a dividing groove that cuts off the annular protruding portion 13 is performed. FIG. 8 is a cross sectional view partially illustrating a cutting apparatus 38 that performs the dividing groove forming step S60. Here, the cutting apparatus 38 will first be explained. The cutting apparatus 38 includes a chuck table 40 that holds the wafer 11 (frame unit 41) and a cutting unit 58 that cuts the wafer 11 held on the chuck table 40.

The chuck table 40 includes a porous member 44 that has a planar-shaped upper surface and that can be housed in the circular recessed portion 15 and a frame body 42 that houses and exposes upward the porous member 44. The frame body 42 includes a circular protruding portion 48 that mainly supports the circular recessed portion 15 of the wafer 11 and an annular support portion 50 that is disposed on the outer circumference of the circular protruding portion 48 and that mainly supports the annular protruding portion 13 of the wafer 11.

The circular protruding portion 48 of the frame body 42 has on its upper surface a housing recessed portion that houses the porous member 44. The planar shape of the upper surface of the circular protruding portion 48 is a shape that can be fit into the circular recessed portion 15 of the wafer 11 and is thus slightly smaller than that of the circular recessed portion 15. The annular support portion 50 of the frame body 42 has a width (distance between the inner circumference and the outer circumference) greater than the width (distance between the inner circumference and the outer circumference) of the annular protruding portion 13 of the wafer 11. The difference in height between the upper surface of the annular support portion 50 and the upper surface of the circular protruding portion 48 is equivalent to the difference in height between the circular recessed portion 15 and the annular protruding portion 13 of the wafer 11. Formed inside the frame body 42 is a suction channel 54 that has one end connected to the porous member 44 and another end connected to a suction source 52 such as an ejector. In FIG. 8, the suction channel 54 is represented by a line for the convenience of description.

When the suction source 52 is operated in a state in which the wafer 11 (frame unit 41) is placed on the chuck table 40, a negative pressure acts on the wafer 11 (especially, the major portions of the circular recessed portion 15) through the suction channel 54 and the porous member 44. That is, the wafer 11 is held under suction on the chuck table 40. Further, the upper surface of the circular protruding portion 48 of the frame body 42 becomes a holding surface 46 for holding the wafer 11 under suction.

On an upper surface of the annular support portion 50, a spacer 56 is disposed. The spacer 56 is formed of an elastic member such as a resin layer, and changes in thickness according to variation in the height difference between the circular recessed portion 15 and the annular protruding portion 13 of the wafer 11. The suction channel 54 formed inside the frame body 42 may be branched, and the branched channel of the suction channel 54 is connected to the spacer 56. When the suction source 52 is operated, a negative pressure also acts on the wafer 11 (especially, the annular protruding portion 13) through the branched channel of the suction channel 54 and the spacer 56. In this case, the wafer 11 is held under suction more firmly.

Further, a rotary drive source (not illustrated) such as a motor is coupled to the chuck table 40 and rotates the chuck table 40 about a rotational axis substantially parallel to the holding surface 46. Moreover, around the chuck table 40, there may be provided a plurality of clamps (not illustrated) for gripping and fixing the annular frame 39 which supports the wafer 11 via the sheet 27.

On the upper side of the chuck table 40, a cutting unit 58 that cuts the wafer 11 is disposed. The cutting unit 58 includes a cylindrical spindle 60 that is disposed along a direction substantially parallel to the holding surface 46 of the chuck table 40. To a distal end portion (one end side) of the spindle 60, an annular cutting blade 64 that cuts the wafer 11 is mounted. Further, a proximal end portion (other end side) of the spindle 60 is rotatably housed in a spindle housing 62. A rotary drive source (not illustrated) such as a motor is housed in the spindle housing 62, and is coupled to the proximal end portion of the spindle 60. The cutting blade 64 rotates by power transmitted from the rotary drive source via the spindle 60.

As the cutting blade 64 mounted to the distal end portion of the spindle 60, for example, a cutting blade of a hub type (hub blade) is used. A hub blade is configured by integration of an annular base made of metal or the like and an annular cutting edge 66 formed along an outer circumferential edge of the base. The cutting edge 66 of the cutting blade of a hub type is configured by electroformed grindstones in which abrasive grains including diamonds or the like are fixed by a binder such as a nickel plating layer. Yet, a cutting blade of a washer type (washer blade) can be used as the cutting blade 64. The washer blade is configured by the annular cutting edge 66 in which abrasive grains are fixed by a binder including metal, ceramic, resin, or the like. In any case, the cutting blade 64 can cut the wafer 11 by the annular cutting edge 66.

The cutting unit 58 is connected to an unillustrated moving unit and can adjust the position where the cutting blade 64 cuts into the wafer 11. Further, the cutting unit 58 is connected to an unillustrated lifting/lowering unit and can change the height position of the lower end of the annular cutting edge 66.

When the wafer 11 is to be cut and the annular protruding portion 13 is to be cut off by the cutting apparatus 38, first, the frame unit 41 is placed on the chuck table 40. At this time, the one side (reverse side 11*b*) of the wafer 11 is oriented toward the holding surface 46, and the position of the wafer 11 is adjusted in such a manner that the center of the holding surface 46 overlaps with the center of the one side of the wafer 11. Thereafter, the suction source 52 is operated, and the wafer 11 is held under suction on the chuck table 40 via the sheet 27. The position in the wafer 11 where the dividing groove is to be formed is set to a circular region having the center of the circular recessed portion 15 as the center. The wafer processing method according to the present embodiment allows the gap 31 between the wafer 11 and the sheet 27 to be sufficiently small, so that the region in which the dividing groove is to be formed can be set to a relatively outer side of the circular recessed portion 15. By the cutting unit 58 being moved, the cutting edge 66 of the cutting blade 64 can be positioned above the region in which the dividing groove is to be formed.

The rotary drive source provided inside the spindle housing 62 is next operated to start the rotation of the cutting blade 64, and the cutting unit 58 is lowered to cause the cutting edge 66 to cut into the wafer 11. The cutting unit 58 is further lowered to a height position where the lower end of the cutting edge 66 reaches the sheet 27, and then, the rotation of the chuck table 40 is started. When the chuck table 40 is rotated once or more, a circular dividing groove is formed in the wafer 11, and the annular protruding portion 13 is cut off from the wafer 11.

Note that the dividing groove forming step S60 is not limited to the one described above. For example, the height of the cutting unit 58 may be adjusted beforehand in such a manner that the height of the lower end of the cutting edge 66 becomes lower than the height of the upper surface of the sheet 27 on the outer side of the wafer 11, and the cutting edge 66 is caused to cut into the wafer 11 from the outer circumference of the wafer 11. That is, the cutting unit 58 and the chuck table 40 are moved in a direction parallel to the holding surface 46, and the cutting edge 66 is caused to cut into the region in which the dividing groove is to be formed. When the chuck table 40 is rotated once in this state, a circular dividing groove is formed in the wafer 11.

After the dividing groove forming step S60, a removing step S70 of removing, from the sheet 27, the annular protruding portion 13 which has been cut off from the wafer 11 is performed. FIG. 7B includes a cross sectional view schematically illustrating the annular protruding portion 13 at the time of being removed from the sheet 27 in the removing step S70. When the frame unit 41 is conveyed out from the chuck table 40 after the annular protruding portion 13 has been cut off from the wafer 11, the portion which had been the circular recessed portion 15 of the wafer 11 and the annular protruding portion 13 remain on the sheet 27. In this state, the annular protruding portion 13 is pulled up to be peeled off from the sheet 27. As a result, a frame unit 41 in which the wafer 11 from which the annular protruding portion 13 has been removed, the sheet 27, and the annular frame 39 are integrated can be obtained. Thereafter, when the wafer 11 is diced along the projected dicing lines 19 (see FIG. 1B), individual device chips each including the device 21 are obtained.

As described above, the wafer processing method according to the present embodiment is capable of disposing the sheet 27 as an alternative to the adhesive tape 33 on the one side (reverse side 11*b*) of the wafer 11 including the circular recessed portion 15, without generating a large gap 31, while keeping the gap 31 from widening over time.

Note that, in the dividing groove forming step 60 in the abovementioned embodiment, there has been described a case in which a dividing groove is formed in the wafer 11 with use of the cutting apparatus 38 on which the cutting blade 64 is mounted, but the aspect of the present invention is not limited to such a case. Specifically, in the dividing groove forming step S60, a laser processing apparatus (not illustrated) that can perform laser processing on the wafer 11 by applying a laser beam to the wafer 11 may be used. For example, a laser beam including a wavelength component that is absorbable by the wafer 11 is applied to a region in the wafer 11 where the dividing groove is slated to be formed, and the wafer 11 is subjected to ablation processing. Alternatively, a laser beam including a wavelength component transmittable through the wafer 11 is converged at a region in the wafer 11 where the dividing groove is slated to be formed, a modifying layer is formed in the wafer 11 along the region, and the wafer 11 is divided with the modifying layer used as the division initiating point. Also in this case, the wafer processing method according to one aspect of the present invention can form the dividing groove at a position relatively close to the outer circumference of the circular recessed portion 15 of the wafer 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer that has one side in which an annular protruding portion is provided on an outer circumferential portion thereof and a circular recessed portion is formed in a region surrounded by the annular protruding portion, by a thermocompression bonding apparatus that includes an upper chamber including a first recessed portion that is coupled to a first depressurizing unit and that has a first opening, a lower chamber including a second recessed portion that is coupled to a second depressurizing unit and that has a second opening, and a holding table that is disposed on the second recessed portion and that holds the wafer, the upper chamber and the lower chamber being closed by the first opening and the second opening being fit together, the wafer processing method comprising:

a holding step of holding the wafer the one side of which is oriented upward, from a lower side by the holding table of the thermocompression bonding apparatus;

a sealing step of sandwiching a sheet of a frame unit including an annular frame having at a center thereof an opening portion capable of housing the wafer and the sheet fixed to an outer circumferential portion of the annular frame, by the first opening of the first recessed portion and the second opening of the second recessed portion, at an inner side of the opening portion, and closing the first recessed portion and the second recessed portion;

a depressurizing step of depressurizing the first recessed portion by the first depressurizing unit and depressurizing the second recessed portion by the second depressurizing unit, after the sealing step;

a contacting step of causing the sheet to come into contact with the annular protruding portion and the circular recessed portion by increasing pressure inside the first recessed portion and causing the sheet to come into contact with the one side of the wafer, after the depressurizing step; and a thermocompression-bonding step of heating the sheet and thermocompression-bonding the sheet to the one side of the wafer, after the contacting step.

2. The wafer processing method according to claim 1, further comprising:

a dividing groove forming step of forming, in the wafer, a dividing groove that cuts off the annular protruding portion, after the thermocompression-bonding step; and a removing step of removing the annular protruding portion from the sheet, after the dividing groove forming step.

* * * * *